United States Patent
Tessarolo et al.

(10) Patent No.: US 8,384,440 B2
(45) Date of Patent: Feb. 26, 2013

(54) HIGH RESOLUTION CAPTURE

(75) Inventors: Alexander Tessarolo, Lindfield (AU); Saya Goud Langadi, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/762,507

(22) Filed: Apr. 19, 2010

(65) Prior Publication Data

US 2012/0319751 A1    Dec. 20, 2012

Related U.S. Application Data

(60) Provisional application No. 61/170,182, filed on Apr. 17, 2009.

(51) Int. Cl.
*G01R 23/02*    (2006.01)

(52) U.S. Cl. ......................................................... 327/39
(58) Field of Classification Search .................... 327/39, 327/100, 427

See application file for complete search history.

*Primary Examiner* — Hai L Nguyen
(74) *Attorney, Agent, or Firm* — Robert D. Marshall, Jr.; Wade James Brady, III; Frederick J. Telecky, Jr.

(57) ABSTRACT

The high resolution capture (HRCAP) of this invention enables time stamping of input signals with very high resolution without requiring high frequency sampling. This invention uses a capture delay line to time stamp an input edge signal as a fraction of the input signal sampling frequency. The capture delay line includes a first input receiving a synchronized signal and a second input receiving the input signal. These inputs propagate toward one another within a sequence of bit circuits. The meeting location within the sequence of bit circuits indicates a time of the input signal transition at a resolution greater than possible via the sampling frequency clock.

4 Claims, 4 Drawing Sheets

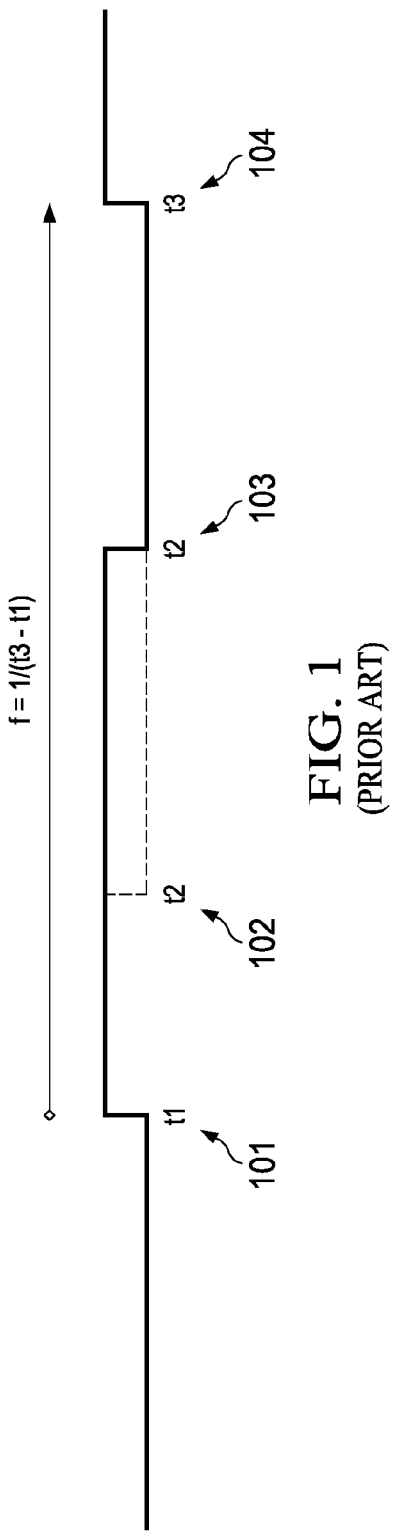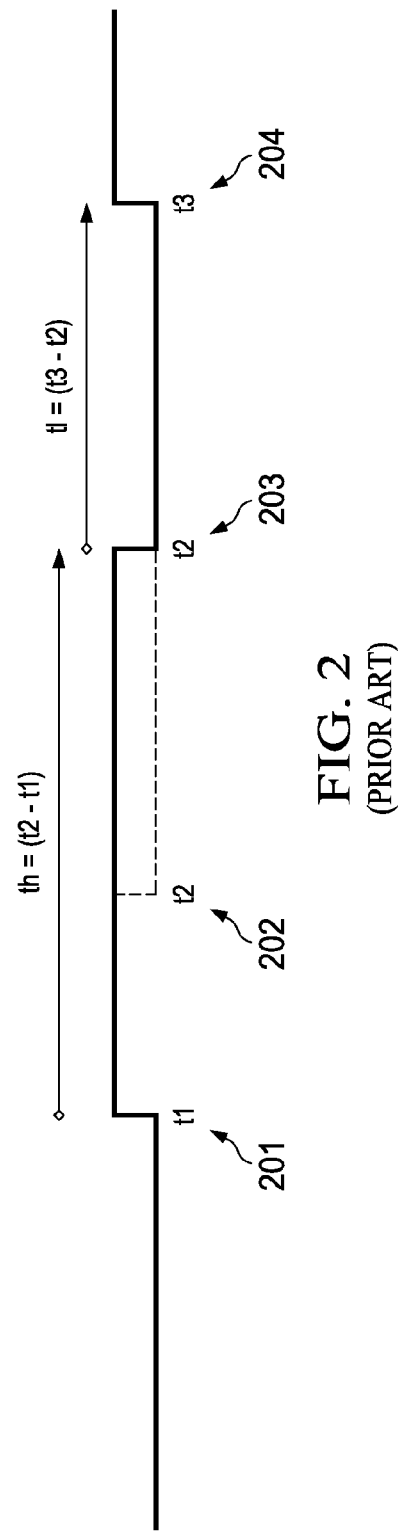

HIGH RESOLUTION CAPTURE

CLAIM OF PRIORITY

This application claims priority under 35 U.S.C. 119 (e)(1) to U.S. Provisional Application No. 61/170,182 filed Apr. 17, 2009.

TECHNICAL FIELD OF THE INVENTION

The technical field of this invention is capture circuits used to measure the time between edges on an input signal.

BACKGROUND OF THE INVENTION

Capture circuits measure the time between edges of an input signal. Capture circuits have many uses. Capture circuits can measure signal frequency. A Hall effect sensor on a motor generates a pulse when a magnetic field crosses the sensor. The frequency of these pulses is directly proportional to the rotating speed of the motor.

FIG. 1 illustrates a prior art method using capture circuits to measure frequency. The capture circuit detects time of the signal transition from low to high at time t1 (101). The input signal returns to low at a variable time t2 from 102 to 103. The capture circuit detects the time of the next signal transition similar to the initial signal transition at time t3 (104). As shown in FIG. 1 the frequency f of the input signal is 1/(t3−t1).

Capture circuits can measure the propagation time of signals. A transmitter generates an ultrasonic signal pulse. The pulse reflects off a distant object and the returning pulse is then received at the source. The pulse time delay from transmission to reception is proportional to the distance traveled by the pulse. Capture circuits can measure the phase shift of signals. The input current of an AC load is measured. Using the input voltage as a reference, a zero crossing circuit generates a pulse which is proportional to the phase difference between the voltage and the current. This pulse duration is proportional to the phase difference. This measured phase difference can be used for power factor correction.

Capture circuits can measure the duty cycle of signals. A circuit generates an output pulse train having a fixed frequency. The high and low pulse widths are proportional to the input voltage to the circuit. Measuring the duration of the high and low pulse enables the signal to be converted back to a digital representation. This method can perform analog to digital conversion.

FIG. 2 illustrates a prior art method measuring duty cycle. The capture circuit detects time of the signal transition from low to high at time t1 (201). The input signal returns to low at a variable time t2 from 202 to 203. The capture circuit detects the time of the next signal transition similar to the initial signal transition at time t3 (104). As shown in FIG. 2 the length of the high signal th is t2−t1 and the length of the low signal tl is t3−t2. The time of one complete cycle T is t3−t1. Thus the high signal duty cycle is th/T or (t2−t1)/(t3−t1). The low signal duty cycle is tl/T of (t3−t2)/(t3−t1).

Existing capture circuits sample an input signal at a sample frequency. This sample frequency is generally a known constant frequency. The capture circuit synchronizes the input signal to the sampling frequency. This synchronization may introduce one to two cycles of sampling delay. The capture circuit then time stamps the input signal edges.

Time stamping is generally performed using a counter incremented at input signal sample rate. Upon detection of an input signal edge, the current counter value is then latched into a register. Upon detection of the next edge transition, the counter value is captured again. Many applications use a new capture register so that multiple time stamp edges can be buffered.

FIG. 3 is a simplified block diagram of a prior art capture circuit 300. Input signal 301 and sample clock 302 having a frequency fs are supplied to synchronization circuit 311. The resultant synchronized signal 303 supplies one input of edge detector 312. Edge detector 312 also receives sample clock 302. Edge detector 312 generates a capture signal upon detection of predetermined edge in the synchronized signal. Free running multibit counter 313 counts at the frequency of sample clock 302. A selected one of registers 321 to 329 captures and stores the plural bit state of free running counter 313 upon receipt of the capture signal from edge detector 312. The value of data stored within registers 321 to 329 enables the various measurements possible with the capture circuit. The data stored within registers 321 to 329 is readable for use in other parts of an electronic system including capture circuit 300 via data output 350.

FIG. 4 illustrates the operation of synchronization circuit 311. Input signal 301 has a transition from low to high at time 401. Operation of synchronization circuit 311 delays the corresponding low to high transition in synchronized signal 303 until time 402 coincident with a low to high transition in sample clock 302. Input signal 301 has a transition from high to low at time 403. Operation of synchronization circuit 311 delays the corresponding high to low transition in synchronized signal 303 until time 404 coincident with a high to low transition in sample clock 302.

The resolution of the capture circuit depends upon sampling techniques and is limited to the sampling frequency. If fs=100 MHz, then the sampling resolution Tsr=1/100 MHz=10.0 nSec. To improve the sampling resolution Tsr, one must increase the sampling frequency fs. To achieve a sampling resolution of 1.0 nSec, requires a sampling frequency fs=1 GHz. To achieve a sampling resolution Tsr of 0.5 nSec, requires a sampling frequency fs=2 GHz.

Achieving such high sampling frequencies is not practical or achievable in many integrated circuit technology nodes or requires special design techniques. In many designs there is a need to have many individual capture circuits and this further limits the maximum usable frequencies. Most low cost embedded processors have frequencies be in the order of 40 MHz to 100 MHz. This limits the practical resolution of such systems to around 25 nSec to 10 nSec.

SUMMARY OF THE INVENTION

The high resolution capture (HRCAP) of this invention enables time stamping of input signals with very high resolution without requiring high frequency sampling. This invention uses a capture delay line to time stamp an input edge signal as a fraction of the input signal sampling frequency. The capture delay line includes a first input receiving a synchronized signal and a second input receiving the input signal. These inputs propagate toward one another within a sequence of bit circuits. The meeting location within the sequence of bit circuits indicates a time of the input signal transition at a resolution greater than possible via the sampling frequency clock.

BRIEF DESCRIPTION OF THE DRAWINGS

These and other aspects of this invention are illustrated in the drawings, in which:

FIG. 1 illustrates the detection of a frequency using capture circuits according to the prior art;

FIG. 2 illustrates the detection of duty cycle using capture circuits according to the prior art;

DETAILED DESCRIPTION OF PREFERRED EMBODIMENTS

Figure 5:
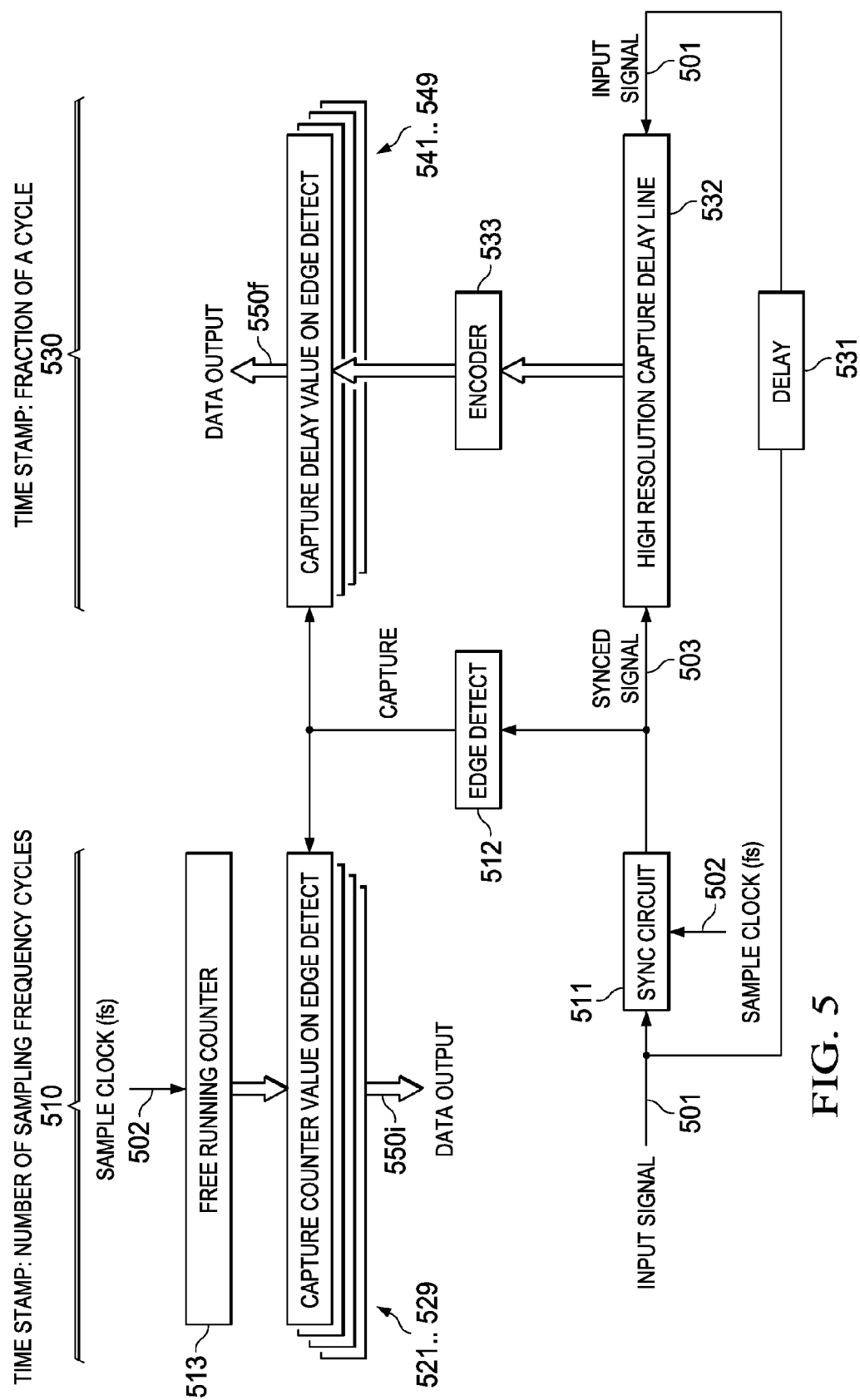
FIG. 5 illustrates a simplified block diagram of the capture circuit of one embodiment of this invention.

FIG. 5 illustrates a block diagram of one embodiment of this invention. Synchronization circuit 511, edge detector 512, free running multibit counter 513 and registers 521 to 529 operate on input signal 501, sample clock 502 and synchronized signal 503 of integer section 510 similarly to like numbered parts in the prior art circuit illustrated in FIG. 3. These parts operate to store what is called the integer part of the captured time in one or more of registers 521 to 529. The data stored within registers 521 to 529 is readable for use in other parts of an electronic system including capture circuit 500 via data output 550i.

Figure 4:
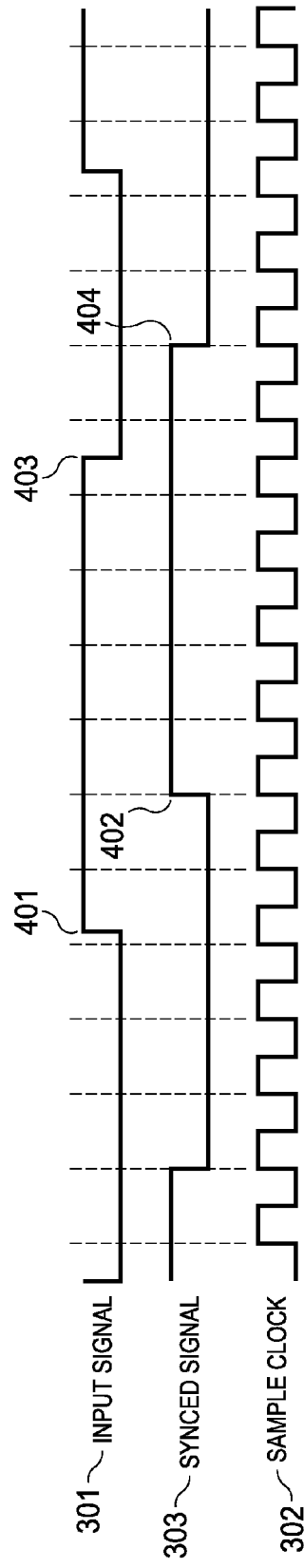
FIG. 4 illustrates the results of operation of the synchronization circuit illustrated in FIG. 3 (prior art)

FIG. 5 includes fractional section 530 which store what is called the fractional part of the captured time in one or more of registers 541 to 549. Fractional section 530 includes delay 531, high resolution capture (HRCAP) delay line 532, encoder 533 and fractional registers 541 to 549. Delay 531 compensates input signal 501 for the inherent one cycle delay in synchronization circuit 511 (see FIG. 4). HRCAP delay line 532 receives input signal 501 and synchronized signal 503 at opposite ends. When the rising edges of these two signals fed to HRCAP delay line 532 they meet, signal propagation freezes. The position of this freeze point indicates the relative occurrence of the signals to each other in time. Encoder 533 encodes the propagation signal from HRCAP delay line 532 for storage in a selected on of registers 541 to 549. The data stored within registers 541 to 549 is readable for use in other parts of an electronic system including capture circuit 500 via data output 550f. Note that the register selected corresponds to the register 521 to 529 selected in integer portion 510. Generally the data from one of registers 521 to 529 will be read simultaneously with data from a corresponding one of registers 541 to 549.

Figure 6:
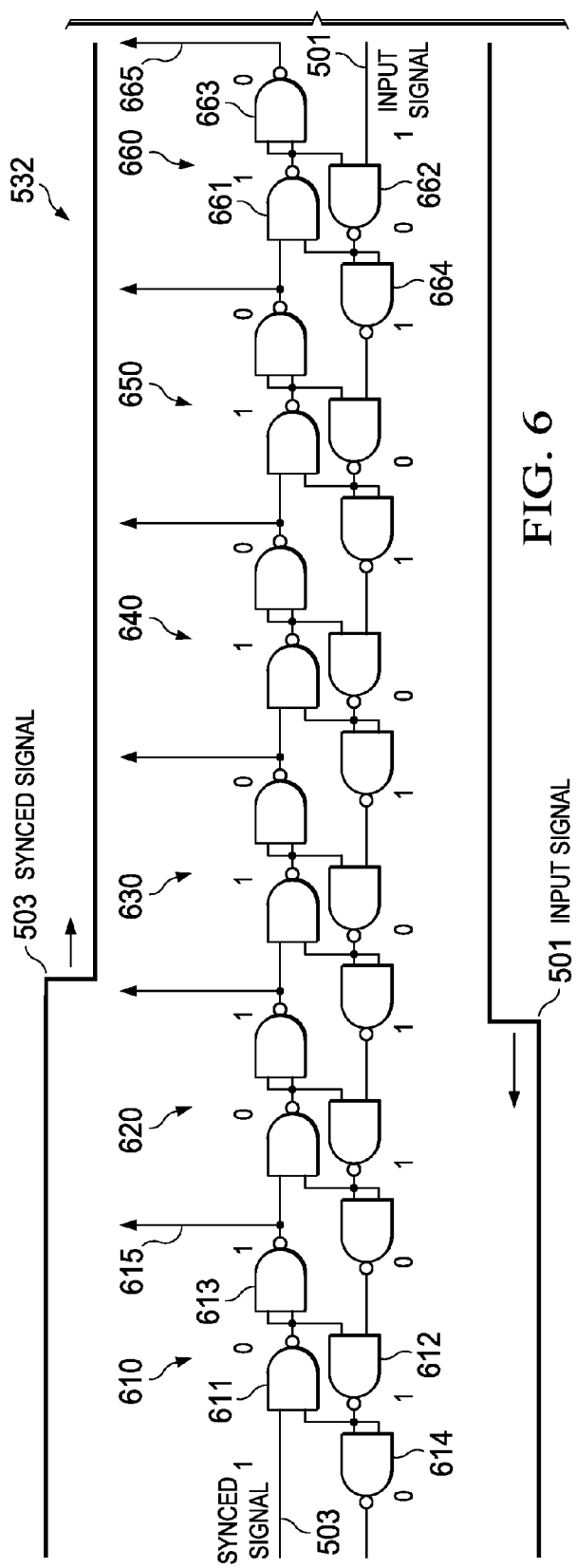
FIG. 6 illustrates a simplified block diagram of the high resolution capture delay line illustrated in FIG. 5.

FIG. 6 illustrates an exemplary embodiment of HRCAP delay line 532. FIG. 6 illustrates fewer bit circuits than would ordinarily be implemented for clarity of description. HRCAP delay line 532 includes plural bit circuit 610, 620, 630, 640, 650 and 660. Bit circuit 610 includes cross-coupled NAND gates 611 and 612 which store a register bit. Forward drive NAND GATE 613 and backward drive NAND GATE 614 are connected as inverters. Note that both forward drive NAND GATE 613 and backward drive NAND GATE 614 operate as inverters and could be replaced with inverters. Forward drive NAND gate 613 supplies one input of a next bit circuit. Backward drive NAND GATE 614 supplies one input a previous bit circuit.

A high ("1") input corresponding to a rising edged of synchronized signal 503 causes NAND gate 611 to produce a low ("0") output. In the absence of any other input, NAND gate 612 produces a high ("1") output. This causes bit circuit 610 to take one of its two stable states. Forward drive circuit 613 thus drives output 615 high ("1"). Forward drive NAND gate 613 propagates the high ("1") input from the rising edge of synchronized signal 503 to bit circuit 620. This causes a similar transition in bit circuit 620. There is a delay in this propagation corresponding to the gate speed of NAND gates 611 and 613. Thus the rising edge of synchronized signal 503 propagates to the left in FIG. 6 as indicated by the arrow on the upper waveform 503.

A high ("1") input corresponding to a rising edged of input signal 501 causes NAND gate 662 to produce a low ("0") output. In the absence of any other input, NAND gate 661 produces a high ("1") output. This causes bit circuit 660 to take one of its two stable states. Forward drive circuit 663 thus drives output 665 high ("1"). Backward drive NAND gate 664 propagates the high ("1") input from the rising edge of input signal 50a to bit circuit 650. This causes a similar transition in bit circuit 650. There is a delay in this propagation corresponding to the gate speed of NAND gates 662 and 664. Thus the rising edge of input signal 501 propagates to the right in FIG. 6 as indicated by the arrow on the lower waveform 501.

These two propagating signals will eventually meet. FIG. 6 illustrates an example where these signals meet in bit circuit 620. In that case the "in the absence of any other input" is no longer true. The cross-coupled NAND gates with each have a "1" input. In this case the status of the bit circuit does not change and neither synchronized signal 503 input signal 501 propagate further. The status of bit circuits 610 to 660 depends upon whether input signal 501 or synchronized signal 503 reached that bit circuit first. This results in a string of "1s" starting at bit circuit 610 going upward and a string of "0s" starting at bit circuit 660 going backward. This results in what is known as a thermometer code. The bit circuit where the propagating signals meet corresponds to a timing difference between these signals. With N bit circuits there are N possible results.

Referring back to FIG. 5, encoder 532 encodes the thermometer code result of HRCAP delay line 532 into a standard multibit format which is stored in a selected one of registers 541 to 549. For example, if there are 128 bit circuits capable of signaling 128 different results, encoder 532 can encode the thermometer code into a 7-bit number because $2^7=128$. This standard multibit format becomes the fractional part of the captured time.

Thus HRCAP delay line 532 produces an indication of the relative delay of input signal 501 to system clock 503. The achievable resolution of the HRCAP delay line 532 is dependent on the resolution of each bit circuit 610 to 660. This equals to four NAND gates of delay. In a 180 nm semiconductor manufacture process this result in an average delay resolution of about 300 pSec. The number of delay elements needed to span one cycle is dependent on the sampling frequency and the variation of delay over temperature and voltage.

This invention requires calibration of the delay elements before HRCAP delay line 532 can be used. Calibration can be performed by generating an input signal that sweeps across fractions of a cycle of sampling clock fs. On microcontroller devices suitable for use with this invention, such as the TMS320C2000 family of microcontrollers from Texas Instruments, generation of such an input signal can be performed using high resolution pulse width technology (PWM) technology. This technology can generate pulses or frequencies with resolutions in the order of about 150 pSec.

Consider this example of a calibration operation. The calibration operation uses the High Resolution PWM circuits on the microcontroller including this invention to generate a signal with a period of 40 cycles. This signal initially has a duty cycle of 50%. The calibration operation reads the HRCAP delay line encoded value from encoder 533. This process repeats for other the duty cycle values incremented by fractions of a cycle, for example 0.01% of a cycle, covering a range of about 2 cycles. This produces a list of duty cycle values and the corresponding encoded output. Table 1 shows such a list.

TABLE 1

| Run | High Pulse | Low Pulse | Encoded Value |
|---|---|---|---|
| 0 | 20.00 | 20.00 | 147 |
| 1 | 20.01 | 19.99 | 148 |
| 2 | 20.02 | 19.98 | 27 |
| 3 | 20.03 | 19.97 | 28 |
| 4 | 20.04 | 19.96 | 29 |
| ... | | | |
| 99 | 20.99 | 19.01 | 146 |
| 100 | 21.00 | 19.00 | 147 |
| 101 | 21.01 | 18.99 | 27 |
| 102 | 21.02 | 18.98 | 28 |
| ... | | | |
| 199 | 21.99 | 18.01 | 147 |

From this list the calibration operation finds maximum and minimum values. In this example the maximum value is 148 and the minimum value is 27. Because of various delays in the circuits, the detected minimum and maximum encoded values do not coincide with the 0.00% input signal offset. This process determines how many HRCAP delay elements make up one cycle. This is calculated by subtracting the minimum value from the maximum value. In this example we have N, the number of HRCAP delay elements to span 1 cycle:

$N = 148 - 27 = 121$ elements

It is possible to construct HRCAP delay line 532 to include a variable number of bit circuits. After the calibration operation, HRCAP delay line 532 is adjusted to this length. The calibration operation is preferably preformed once before initial use of the capture circuit and periodically thereafter. This permits compensation for drifts in the bit circuits due to changes in temperature and voltage.

Figure 7:
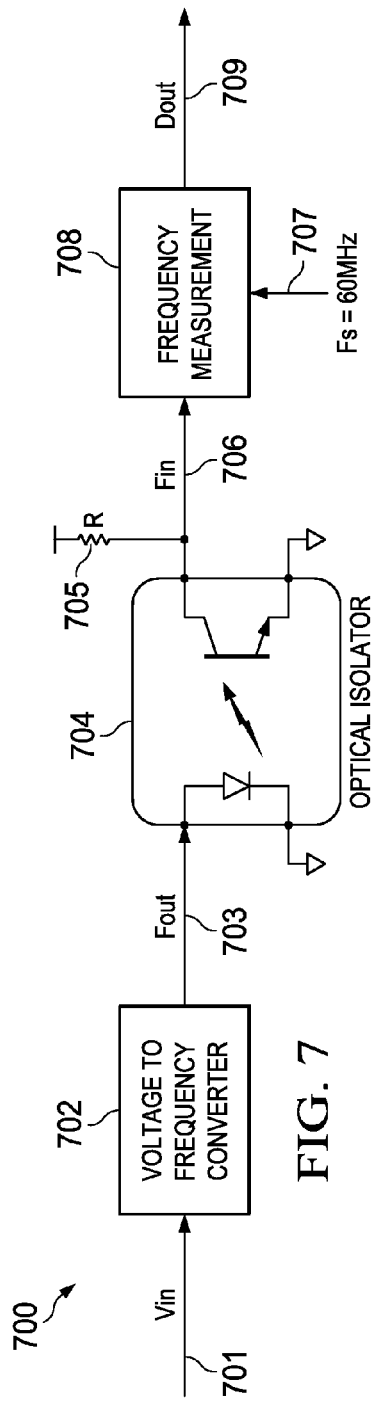
FIG. 7 illustrates an example analog to digital conversion circuit to which this invention is applicable.

FIG. 7 illustrates a simplified block diagram of a practical example circuit 700 converting an isolated analog input signal into a representative digital value using a voltage to frequency converter using this invention. This example is a low cost method implementing an isolated analog to digital converters. Circuit 700 includes voltage to frequency converter 702 which receives an input Vin 701 and generates a corresponding output having a frequency Fout 703. In this example: an input Vin of 2 V results in an output signal have a frequency Fout of 1 MHz; and an input Vin of 0 V results in an output having a frequency Fout of 500 kHz. This output 703 supplies an input to optical isolator 704. Optical isolator 704 provides an output signal designated Fin 706 at an output also connected to pull up resistor 705. Fin 706 supplies an input to frequency measurement circuit 708 which also receive a sampling clock input Fs. In this example sampling clock Fs has a frequency of 60 MHz. Frequency measurement circuit 708 generates a multibit digital signal Dout 709 which corresponds to the frequency of input Fin 706. Because the frequency of input Fin 706 corresponds to the voltage of input Vin 701 by operation of voltage to frequency converter 702, Dout 709 corresponds to the voltage of input Vin 701.

Table 2 compares the effective resolution and latency of three methods of frequency measurement used in frequency measurement circuit 708. An ideal solution would have good ADC bit resolution and low group latency. The first method (prior art) counts the number of Fin cycle over a time period measured by a 16-bit counter clocked by Fs 707. The bit resolution of this first method is:

$$\text{Resolution} = \frac{\ln\left((1\text{ MHz} - 500\text{ KHz}) * \frac{2^{16}}{60\text{ MHz}}\right)}{\ln(2)}$$

This calculates to about 9.1 bits. The latency is the time needed for a 16-bit count at 60 MHz or:

$$\text{Latency} = \frac{2^{16}}{60\text{ MHz}}$$

This calculates to about 1.09 mSec. As noted in Table 1 this first method provides good bit resolution and high latency.

Figure 3:
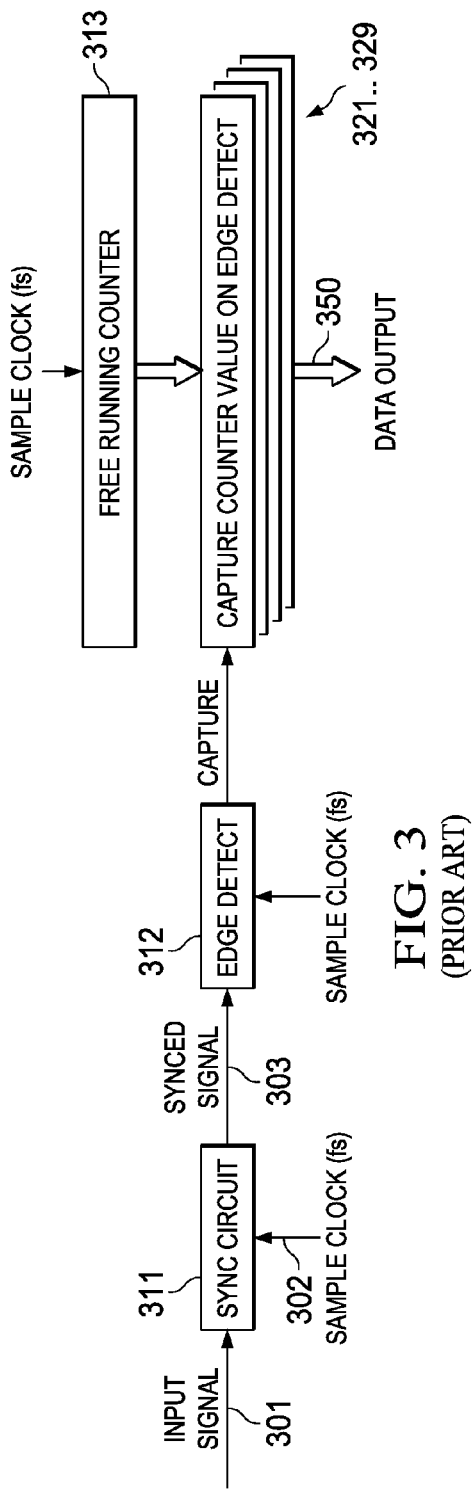
FIG. 3 illustrates a simplified block diagram of a prior art capture circuit.

The second method measures the input frequency Fin using traditional input capture as illustrated in FIG. 3 with a sampling clock frequency of 60 MHz. The bit resolution of this second method is:

$$\text{Resolution} = \frac{\ln\left(\frac{60\text{ MHz}}{500\text{ KHz}} - \frac{60\text{ MHz}}{1\text{ MHz}}\right)}{\ln(2)}$$

This calculates to about 5.9 bits. The average latency of this second method is the time needed for two edge captures at the two extremes of frequency 500 KHz and 1 MHz. This is:

$$\text{Latency} = \frac{\left(\frac{1}{1\text{ MHz}} + \frac{1}{500\text{ KHz}}\right)}{2}$$

This calculates to about 1.5 μSec. As noted in Table 1 this second method provides low bit resolution and low latency.

The third method measures the input frequency Fin using the inventive circuit illustrated in FIG. 5 with a sampling clock frequency of 60 MHz. In this example the high resolution delay line provides a resolution of about 300 pSec. The bit resolution of this third method is:

$$\text{Resolution} = \frac{\ln\left(\frac{1}{\frac{300\text{ }pSec}{500\text{ KHz}}} - \frac{1}{\frac{300\text{ }pSec}{1\text{ MHz}}}\right)}{\ln(2)}$$

For this example this calculates to be about 11.7 bits. The average latency of this third method is the time needed for two edge captures at the two extremes of frequency 500 KHz and 1 MHz. This is:

$$\text{Latency} = \frac{\left(\frac{1}{1\text{ MHz}} + \frac{1}{500\text{ KHz}}\right)}{2}$$

This calculates to about 1.5 μSec. As noted in Table 1 this third method provides high bit resolution and low latency.

TABLE 2

| | Resolution | Latency | Summary |
|---|---|---|---|
| Period Count | 9.1 bits | 1.09 mSec | Good Resolution High Latency |
| Input Time Capture | 5.9 bits | 1.5 µSec | Low Resolution Low Latency |
| HRCAP Delay Line | 11.7 bits | 1.5 µSec | High Resolution Low Latency |

This in this example the HRCAP method of this invention produces the best quality result.

Another method known in the prior art to achieve high resolution is to increase the frequency of the sampling clock fs. As noted above a resolution of 0.5 nSec can be achieve with a sampling frequency fs of 2 GHz. This know prior art technique is disadvantageous because the high frequency circuits necessary to work with a 2 GHz sampling clock frequency require high power. These high frequency circuits also tend to produce high heat which can adversely affect nearby circuits. This invention enables resolution that the prior art could only achieve with higher sampling clock frequency with its disadvantageous power consumption and heat generation.

The HRCAP technology of this invention enables unique solutions to some practical problems. One example is the low cost isolated analog to digital conversion example of FIG. 7. A second example improves the accuracy of distance measuring devices where the time delay of a pulse is proportional to distance. In another example, this invention can be used to measure output signal latency relative to system clock for on-chip self-test characterization.

What is claimed is:

1. A time capture circuit comprising:
    an input terminal receiving an input signal having a state transition;
    a synchronization circuit having a first input connected to said input terminal, a second input receiving a sample clock signal and an output, said synchronization circuit producing at said output a synchronized signal having a state transition corresponding to said state transition in said input signal delayed to a corresponding state transition in said sample clock signal;
    an edge detector having an input connected to said output of said synchronization circuit and an output, said edge detector producing at said output a capture signal upon detection of said state transition in said synchronized signal;
    a multibit counter having an input receiving said sample clock signal and a plurality of bit outputs, said multibit counter counting said plurality of bit outputs at a rate of said sample clock signal;
    an integer register having a number of bits at least as great as a number of bits of said multibit counter, said integer register having bit inputs connected to corresponding bit output of said multibit counter and an enable input receiving said capture signal from said edge detector, said register storing said bit outputs of said multibit counter upon receipt of said capture signal;
    a high resolution capture delay line including a plurality of bit circuits disposed in sequence from a first bit circuit to a last bit circuit, each bit circuit having:
        a first NAND gate having a first input, a second input and an output, said first input of said first bit circuit connected to said output of said synchronization circuit receiving said synchronized signal,
        a second NAND gate having a first input connected to said output of said first NAND gate, a second input and an output connected to said second input of said first NAND gate,
        a first inverter having an input connected to said output of said first NAND gate and an output producing a bit circuit output and connected to said first input of said first NAND gate of a next sequential bit circuit, and
        a second inverter having an input connected to said output of second NAND gate and an output connected to said second input of a prior sequential bit circuit,
        wherein said first input of said first NAND gate of said first bit circuit is connected to said synchronization circuit to receive said synchronized signal, and
        wherein said second input of said second NAND gate of said last bit circuit is connected to said input terminal to receive said input signal;
    an encoder circuit having plural bit inputs, each bit input connected to a bit output of a corresponding one of said bit circuits and an output generating an encoded multibit signal corresponding to said outputs of said plurality of bit circuits; and
    a fractional register having a number of bits at least as great as a number of bits of said encoded multibit signal, said fractional register having bit inputs connected to said output of said encoder circuit and an enable input receiving said capture signal from said edge detector, said fractional register storing said encoded multibit signal from said encoder circuit upon receipt of said capture signal.

2. The time capture circuit of claim 1, wherein:
    said integer register comprises a plurality of integer registers and wherein said bit outputs of said multibit counter are stored in a selected one of said integer registers; and
    said fractional register comprises a plurality of fractional registers equal in number to a number of said plurality of integer registers and wherein said encoded multibit signal is stored in a selected one of said fractional registers corresponding to said selected one of said integer registers.

3. The time capture circuit of claim 2, wherein:
    said plurality of integer registers further includes a multibit data output for reading data from a selected one of said integer registers; and
    said plurality of fractional registers further includes a multibit data output for reading data from a selected one of said fractional registers corresponding to said selected one of said integer registers.

4. The time capture circuit of claim 1, wherein:
    a first inverter consists of a third NAND gate having a first input and a second input, each connected to said output of said first NAND gate, and an output; and
    a second inverter consist of a fourth NAND gate having a first input and an second input, each connected to said output of second NAND gate, and an output.

* * * * *